US006511871B2

United States Patent
Joo et al.

(10) Patent No.: US 6,511,871 B2
(45) Date of Patent: *Jan. 28, 2003

(54) METHOD OF FABRICATING THIN FILM TRANSISTOR

(75) Inventors: Seung-Ki Joo, Seoul; Tae-Kyung Kim, Kyongki-do, both of (KR)

(73) Assignee: L.G. Philips LCD Co., Ltd, Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/794,770

(22) Filed: Feb. 28, 2001

(65) Prior Publication Data

US 2001/0018240 A1 Aug. 30, 2001

Related U.S. Application Data

(63) Continuation of application No. 09/143,305, filed on Aug. 28, 1998, now Pat. No. 6,221,702.

(30) Foreign Application Priority Data

Feb. 10, 1998 (KR) .............................................. 98-3781

(51) Int. Cl.[7] .............................................. H01L 21/00
(52) U.S. Cl. ........................ 438/166; 438/486; 438/487
(58) Field of Search ................................ 438/166, 486, 438/487, FOR 200, FOR 269, FOR 478, FOR 481, 149; 257/64–66

(56) References Cited

U.S. PATENT DOCUMENTS

| | | |
|---|---|---|
| 5,147,826 A | 9/1992 | Liu et al. |
| 5,275,851 A | 1/1994 | Fonash et al. |
| 5,403,762 A | 4/1995 | Takemura |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,501,989 A | 3/1996 | Takayama et al. |
| 5,529,937 A | 6/1996 | Zhang et al. |
| 5,543,352 A | 8/1996 | Ohtani et al. |
| 5,550,070 A | 8/1996 | Funai et al. |
| 5,569,610 A | 10/1996 | Zhang et al. |
| 5,585,291 A | 12/1996 | Ohtani et al. |
| 5,821,562 A | 10/1998 | Makita et al. |

FOREIGN PATENT DOCUMENTS

| | | | |
|---|---|---|---|
| JP | 406310532 A | * | 11/1994 |
| JP | 8006053 | | 1/1996 |

OTHER PUBLICATIONS

Tiao–Yuan Huang, "A Simpler 100–V Polysilicon TFT with Improved Turn–on Characteristics", IEEE Electron Device Letters, vol. 6, Jun. 1990, pp 244–246.*

Lee, Seok–Woon, Yoo–Chan Jeon, and Seung–Ki Joo, "Pd Induced Lateral Crystallization of Amorphous Si Thin Films," Appl. Phys. Lett. 66 (13), Mar. 27, 1995, pp. 1671–1673.

Kuo, Yue and P.M. Kozlowski, "Polycrystalline Silicon Formation by Pulsed Rapid Thermal Annealing of Amorphous Silicon," Appl. Phys. Lett. 69 (8), Aug. 19, 1996, pp. 1092–1094.

Kawazu, Yunosuke, Hiroshi Kudo, Seinosuke Onari and Toshihiro Arai, "Low–Temperature Crystallization of Hydrogenated Amorphous Silicon Induced by Nickel Silicide Formation," *Japanese Journal of Applied Physics.* vol. 29, No. 12, Dec., 1990, pp. 2698–2704.

* cited by examiner

Primary Examiner—George Fourson
Assistant Examiner—Thanh V Pham
(74) Attorney, Agent, or Firm—McKenna Long & Aldridge

(57) ABSTRACT

The present invention relates to a method of fabricating a thin film transistor in which a metal silicide line generated from Metal Induced Lateral Crystallization is located at the outside of a channel region. The present invention includes the steps of forming a semiconductor layer on a substrate wherein the semiconductor layer has a first region, a channel region and a second region in order, forming a gate insulating layer/a gate electrode on the channel region, doping the first and the second region heavily with impurity, forming a metal film pattern making the first region a metal-offset, and crystallizing the semiconductor layer by means of applying thermal treatment to the semiconductor layer having the metal film.

20 Claims, 8 Drawing Sheets

—————— CONVENTIONAL TFT
– – – – – Ni OFF-SET DRAIN TFT
·······  Ni OFF-SET SOURCE TFT

METHOD OF FABRICATING THIN FILM TRANSISTOR

This application is a continuation of application Ser. No. 09/143,305, filed Aug. 28, 1998, now U.S. Pat. No. 6,221,702.

BACKGROUND OF THE INVENTION

1. Field of Invention

The present invention relates to a methods of fabricating a thin film transistor in which a metal silicide line generated from Metal Induced Lateral Crystallization is located at the outside of a channel region.

2. Discussion of Related Art

A polycrystalline silicon TFT (Thin Film Transistor) is used rather than an armophous silicon TFT for high resolution and fast operation speed in a liquid crystal display. The development of laser crystallization enables fabriction of; polysilicon TFT's on a large-sized glass substrate under a temperature similar to a temperature in a process of fabricating armophous silicon TFT'S. However, the TFT fabricated by laser crystallization requires a long processing time and the related process equipments, causes difficulties in mass production.

Armophous silicon under a metal layer becomes crystallized by thermal treatment in MIC (Metal Induced Crystallization) after a specific metal layer has been formed on an armophous silicon layer. MIC enables low temperature crystallization and needs no equipments of high expenses. In spite of the merit of the low temperature crystallization, MIC causes metal contamination which deteriorates and changes the intrinsic characteristics of silicon due to the introduction of metal into the crystallized film.

A new crystallization method called Metal Induced Lateral Crystallization "MILC"[S. W. Lee & S. K. Joo, IEEE Electron Device Lett., 17(4), P.160, (1996)] has been proposed. MILC enables the crystallization of armophous silicon under a low temperature of about 400° C. A crystallization of armophous silicon progresses laterally as the boundary of the silicon crystallized by MIC in MILC. Namely, the crystallization of silicon is induced laterally against the crystallization by MIC.

FIG. 1A to FIG. 1D show cross-sectional views of fabricating a TFT in which a silicon layer crystallized by MILC is used as a channel region.

Referring to FIG. 1A, an armophous silicon layer is deposited on an insulated substrate 100 on which a buffer layer has been formed. An active layer 10 is formed by patterning the armophous silicon layer by photolithography. A gate insulating layer 11 and a gate electrode 12 are formed on the active layer 10 by a conventional method.

Referring to FIG. 1B, a nickel film 13 having a thickness of 20 Å is deposited on the whole surface by sputtering. Accordingly, the portion of active layer on which the gate electrode 12 is not formed contacts the nickel film 13.

Referring to FIG. 1C, a region 10S and a drain region 10D which are doped heavily with impurity are formed in the active layer 10 by ion-implantation. A channel region 10C lies between the source 10S and the drain 10D.

Referring to FIG. 10D, the active layer of armophous silicon; 10 is crystallized by a thermal treatment of 300 to 500° C. to the substrate 100 after the above step. Consequently, A portion of armophous silicon of the source 10S and drain 10D on which the nickel film has been formed is crystallized by MIC, while the other portion of armophous silicon where the channel 10C has been formed is crystallized by MILC.

FIG. 2A shows a TEM picture of a nickel-silicide line formed in the middle of the channel, and FIG. 2B shows a layout of a TFT after the crystalization by a conventional method wherein the arrows indicate the directions of crystallization by MILC. As shown in FIGS. 2A and 2B, an Ni-silicide line is formed in the middle of the channel region in the active layer. The thin Ni-silicide precipitates formed in the source and the drain crystallize silicon and move to the channel region. Accordingly, the Ni-silicide precipitates started to move from both ends of the source and the drain meet each other at the middle of the channel region, resulting in a Ni-silicide line. The Ni-silicide line becomes a defect deteriorating device characteristics, such as, the field effect mobility and the threshold voltage to lower the electrical characteristics of polysilicon TFT'S.

SUMMARY OF THE INVENTION

Accordingly, the present invention is directed to a method of fabricating a thin film transistor that substantially one or more of the problems due to limitations and disadvantages of the related art.

The object of the present invention is to provide a method of fabricating TFT which prevents the metal-silicide from being a defect in the channel region by means of locating the metal-silicide line outside the channel region.

Another object of the present invention is to provide a method of fabricating TFT which improves the characteristics of the TFT by means of crystallizing the semiconductor layer by MILC and simultaneously locating the metal-silicide lane generated therein outside the channel region.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a semiconductor layer on a substrate, said semiconductor layer having a first region, a channel region and a second region in order; forming a gate insulating layer and a gate electrode on said channel region; doping said first and said second region heavily with impurity; forming a metal film pattern making said first region a metal-offset; and crystallizing said semiconductor layer through thermal treatment of said semiconductor layer having said metal film.

Also, the present invention includes a method a thin film transistor comprising the steps of forming a semiconductor layer on a substrate, said semiconductor layer having a first region, a channel region and a second region in order, forming a gate insulating layer and a gate electrode on said channel region, forming a metal film pattern making said first region a metal-offset, doping said first and said second region heavily with impurity, and crystallizing said semiconductor layer through thermal treatment of said semiconductor layer having said metal film.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

FIGS. 3A to 3D show cross-sectional views of a TFT according to the present invention in which an Ni-offset is formed at a portion of the drain or at the source, and MILC using Ni is applied to an armophous silicon layer.

Figure 1A:
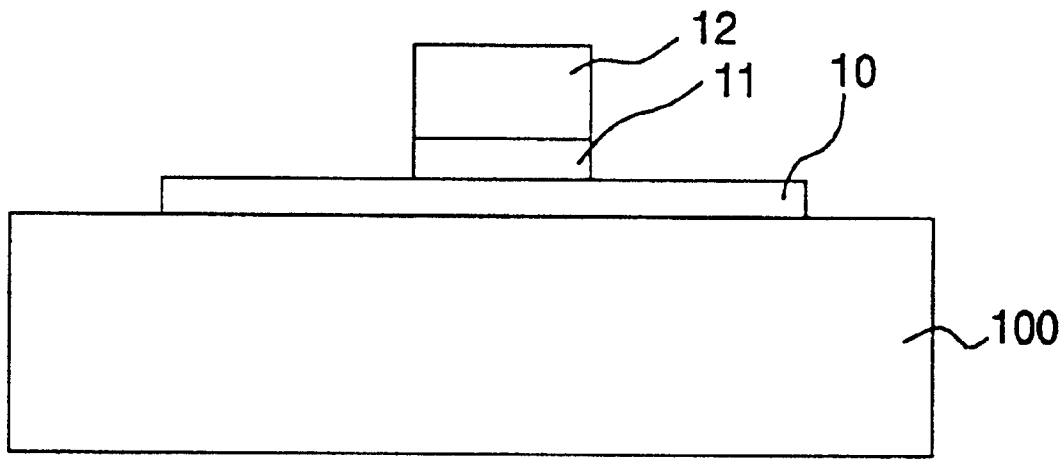
FIG. 1A to FIG. 1D show cross-sectional views of fabricating a TFT according to a conventional art.
Figure 1B:
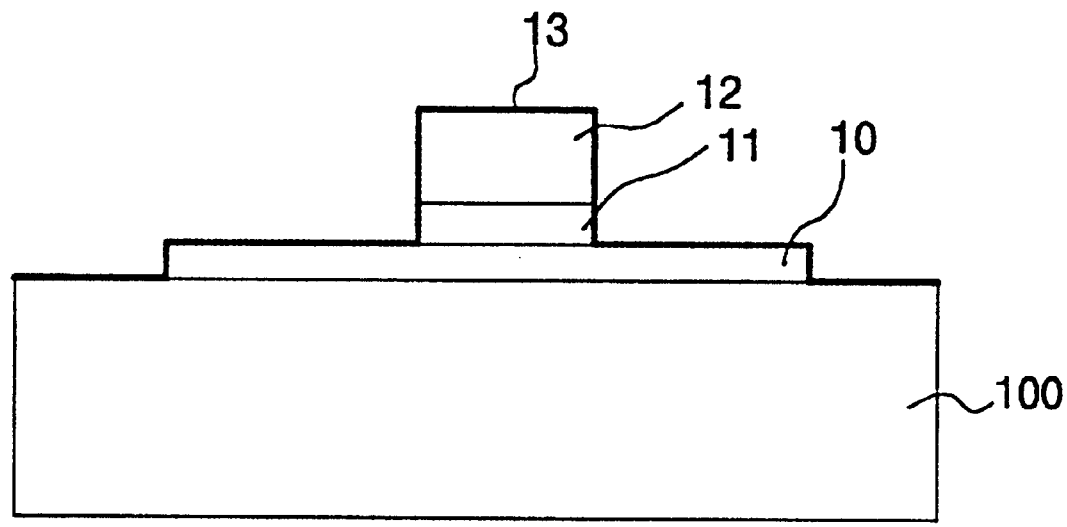
Figure 1C:
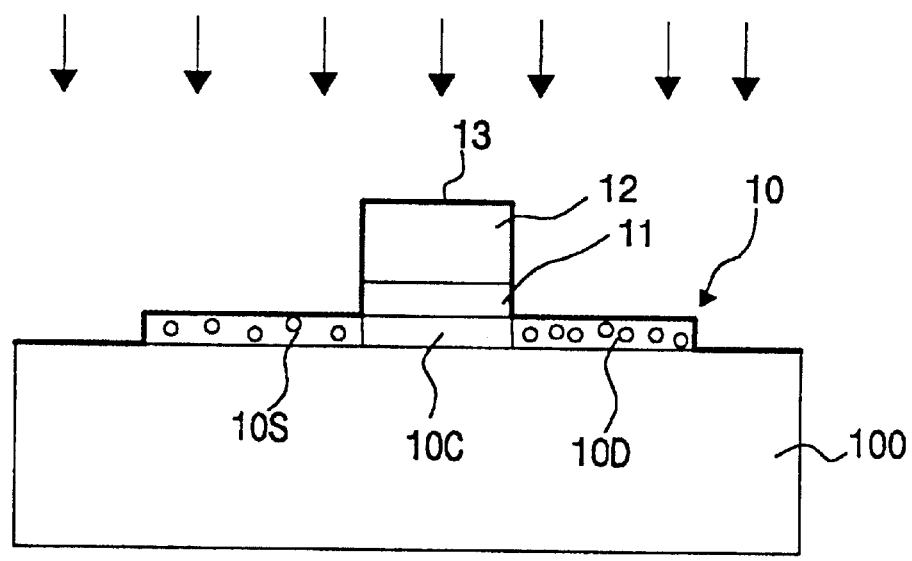
Figure 1D:
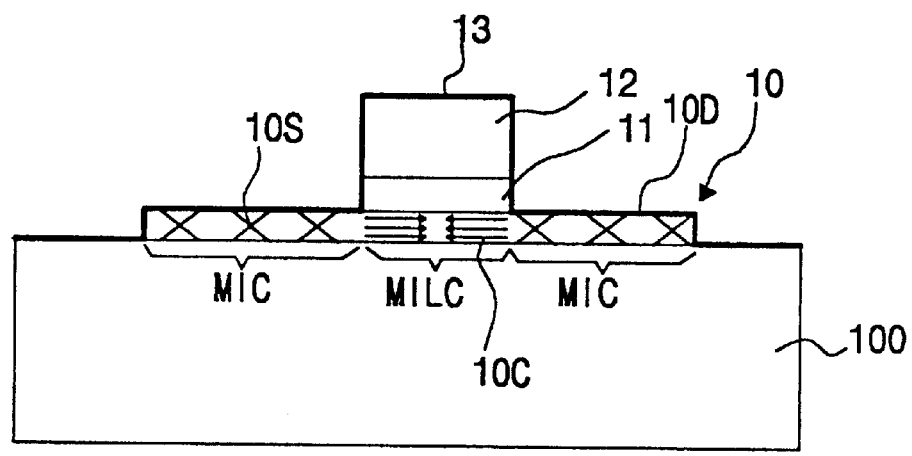
Figure 2A:
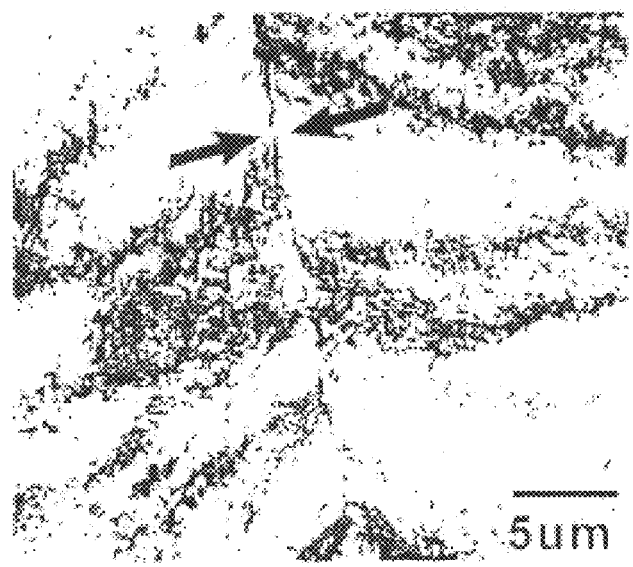
FIG. 2A shows a TEM picture of a nickel-silicide line formed in the middle of the channel.
Figure 2B:
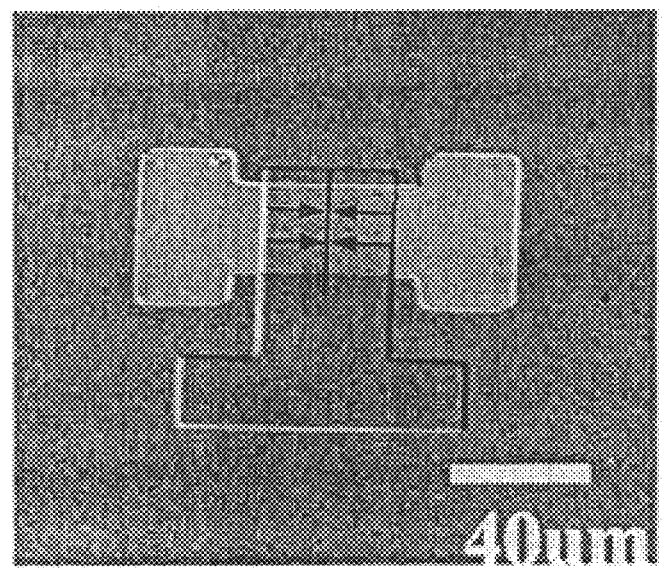
FIG. 2B shows a layout of a TFT after the crystallization, according to a conventional method.
Figure 3A:
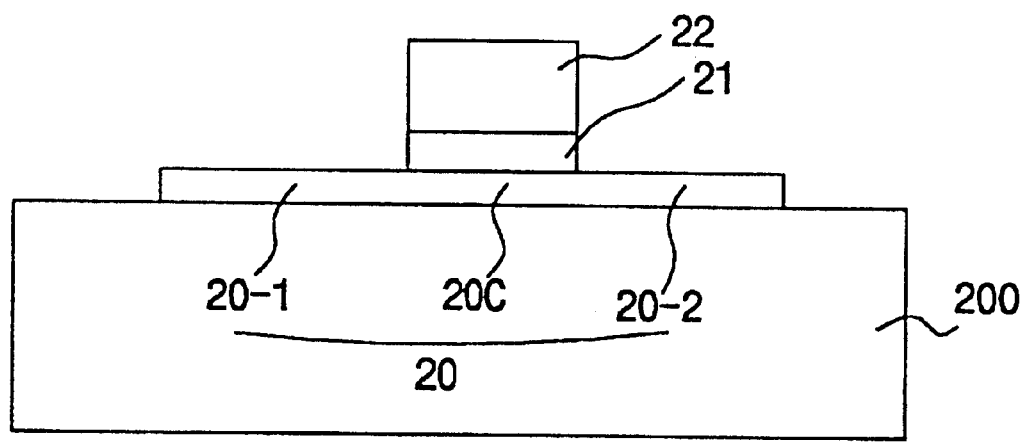
FIGS. 3A to 3D show cross-sectional views of fabricating TFT according to the present invention.

Referring to FIG. 3A, an armophous silicon layer is deposited to the thickness of about 1000 Å for example LPCVD (Low Pressure Chemical Vapor Deposition) on an insulated substrate 200 on which a buffer layer has been formed. An active layer 20 is formed by patterning the armophous silicon layer by photolithography. An oxide layer for a gate insulating layer is deposited to a thickness of about 1000 Å for example ECR (Electron Cyclotron Resonance)—plasma oxidation and ECR-PECVD (Electron Cyclotron Resonance—Plasma Enhanced Chemical Vapor Deposition), and then an Mo layer for a gate electrode is deposited to a thickness of 2000 Å by sputtering, for example.

A gate electrode 22 and a gate insulating layer 21 is formed by patterning the Mo layer and the oxide layer with photolithography respectively. Automatically, a channel region 20C and a first region 20-1 and a second region 20-2 are defined in the active layer 20, wherein the channel region 20C lies between the first and the second regions 20-1 and 20-2.

Figure 3B:
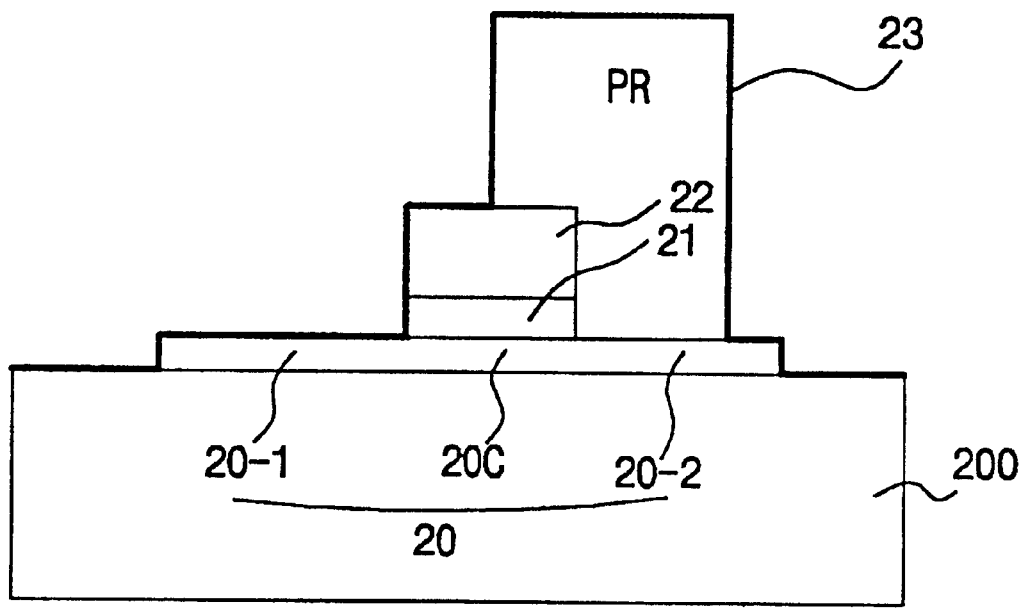

Referring to FIG. 3B, photoresist is coated on the whole surface. Then, a photoresist pattern PR is formed by a selective exposure and development. The photoresist pattern PR, as shown in FIG. 3B, is defined to cover a portion of the second region 20-2 in the active layer close go the gate. Namely, the photoresist pattern is defined asymmetrically with reference to the gate. An Ni film 23, as an inducing metal for crystallization by MIC, is deposited to a thickness of 20 to 200 Å by sputtering.

Figure 3C:
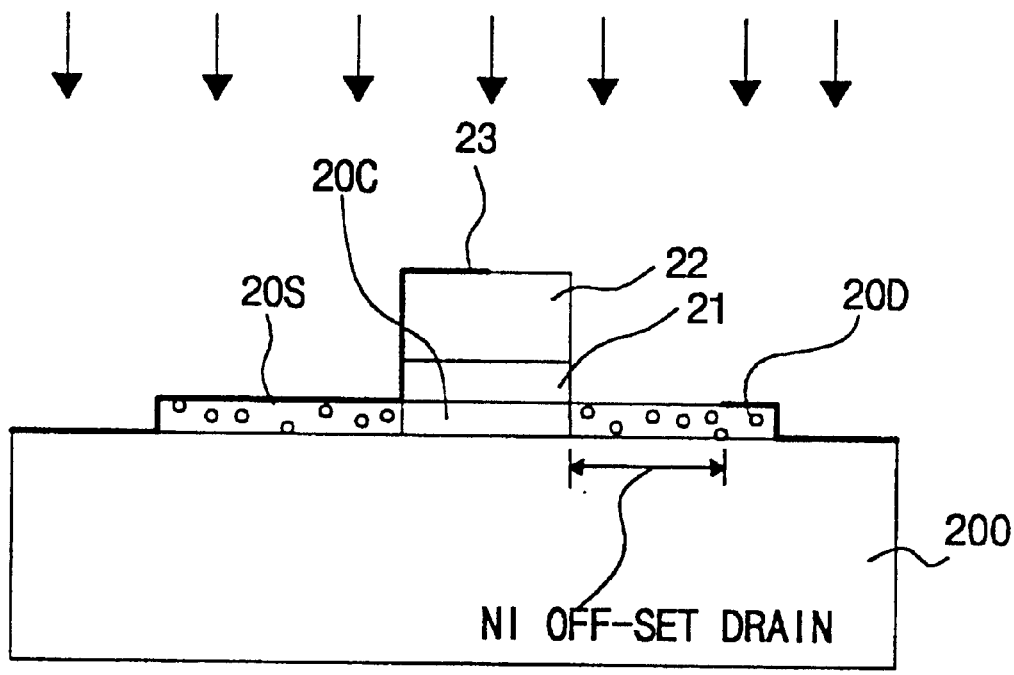

Referring to FIG. 3C, the photoresist pattern PR is removed by lift-off to eliminate the portion of the Ni film which is on the photoresist pattern PR. Accordingly, an inner portion of the second region 20-2, i.e. the second region 20-2 near the gate, becomes a Ni-offset region.

A source region 20S and a drain region 20D are formed in the active layer 20 by doping heavily the whole surface of the substrate with n-typed impurities. In this case, the gate becomes a doping mask against the channel region and a portion of the drain region becomes an Ni-offset drain region.

Figure 3D:
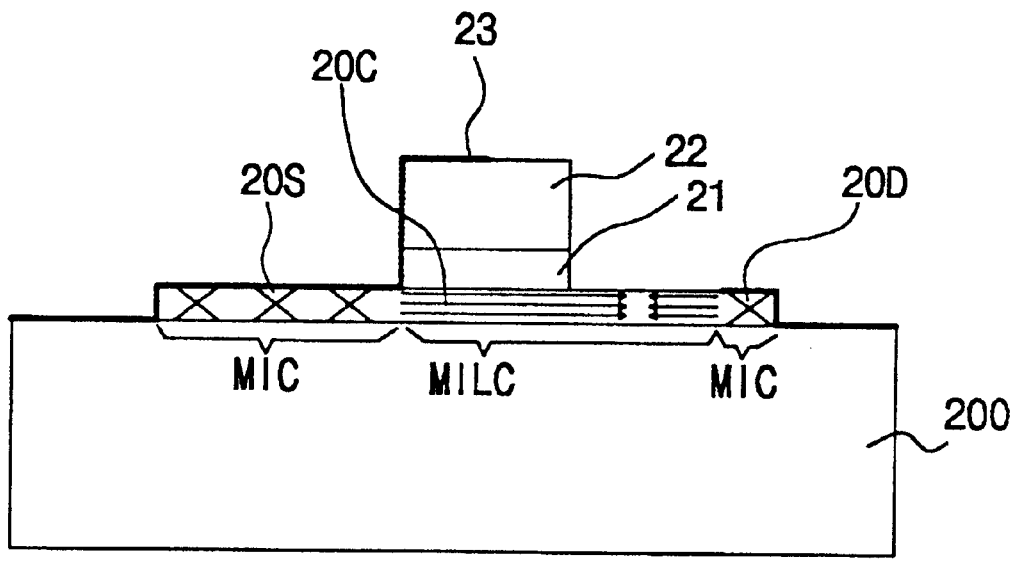

Referring to FIG. 3D, the active layer of armophous silicon becomes crystallized by a thermal treatment on the substrate under a temperature between 300 and 500° C. As shown in FIG. 3D, a portion of armophous silicon where Ni lies is crystallized by MIC, while the other portions of the armophous silicon including the channel region not contacting Ni and the Ni-offset drain region are crystallized by MILC. A boundary of the crystallized silicon by MIC becomes new seeds for MILC by which silicon in the channel region and the Ni-offset drain region is crystallized laterally. In this case, the crystallized silicon portions grown from both ends meet in the Ni-offset drain region to form an Ni-silicide line. Consequently, the Ni-silicide line is located outside the channel region.

Figure 4:
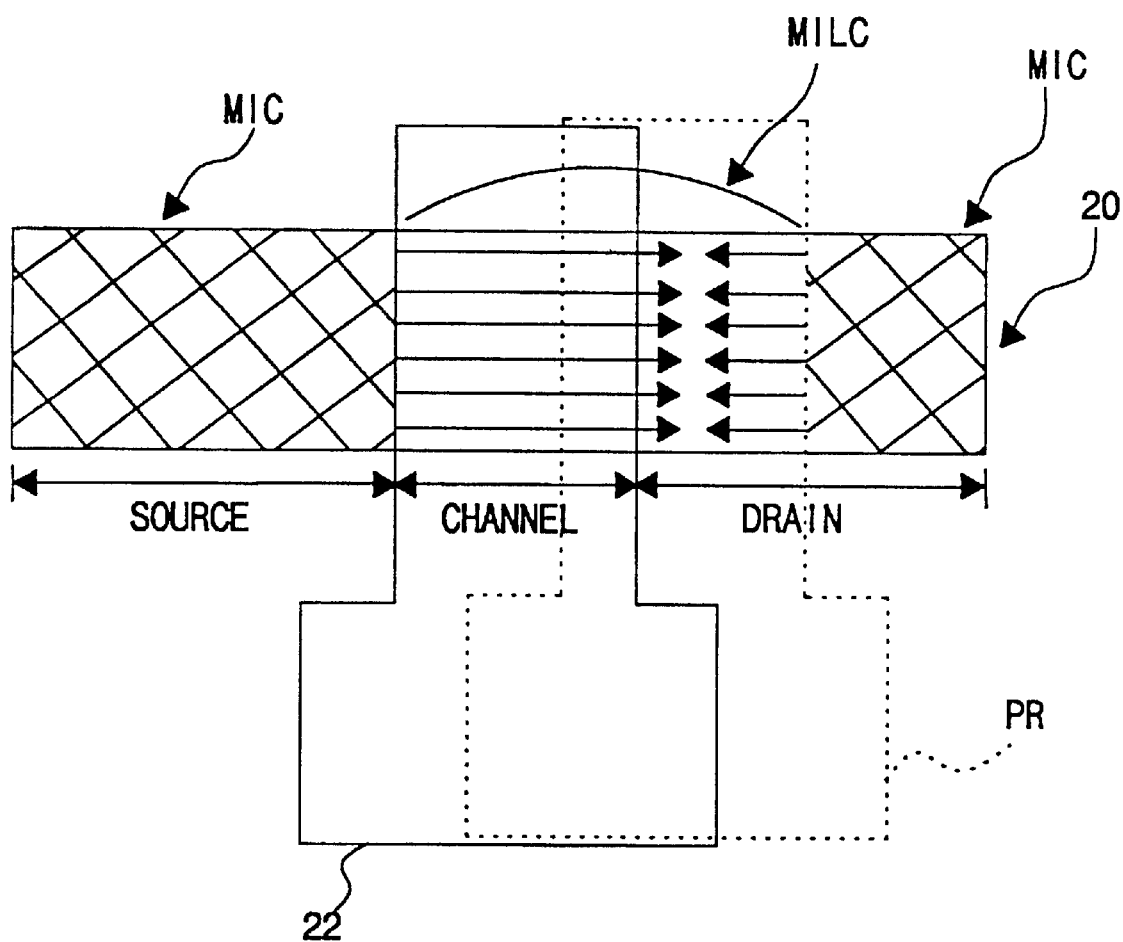
FIG. 4 shows crystallization of TFT according to the present invention.

FIG. 4 shows states of crystallization of the TFT according to the present invention.

Referring to FIG. 4, a gate electrode 22 is on an active layer of amorphous silicon layer 20, on which a photoresist pattern PR is located toward the drain region. Accordingly, a portion of the amorphous silicon layer on which the gate electrode and the photoresist pattern are located becomes an Ni-offset provided that an Ni film is deposited thereon.

When a thermal treatment is applied to the substrate, a portion of the amorphous silicon contacting Ni becomes crystallized by MIC on account of the induction of Ni, while the other portion of the amorphous silicon not contacting Ni becomes crystallized by MILC. In MILC, the crystalliztion of silicon progresses laterally by means of having the boundary of the silicon having been crystallized by MIC as new seeds. In this case, the crystallized silicons having been grown from the ends of the source and the drain, respectively, meet each other at the drain region of the amorphous silicon layer where a Ni-silicide line is to be formed.

Hence, the Ni-silicide line is prevented from being formed in the channel region. As discussed above, Ni-silicide in the channel region should be avoided because it causes defects in the channel region which deteriorates the field effect mobility and the threshold voltage. The Ni-silicide line lowers the device characteristics.

In the foregoing embodiment, Ni preferably used as an inducing metal. Other metals can be used as the inducing material, including one of or mixture a metals such as Pd, Ti, Ag, Au, Al, Sn, Sb, Cu, Co, Cr, Mo, Tr, Ru, Rh, Cd, Pt or the like. In the present invention, a portion of the drain region becomes the Ni-offset or a metal-offset region. With the same method, a portion of the source region can become the Ni-offset region or a metal-offset region to crystallize amorphous silicon. The only difference is that the photoresist pattern is formed to cover the portion of the source region near the gate. In this case, a portion of the source region not contacting Ni is called an Ni-offset source region in the following explanation, and an Ni-silicide line or a metal-silicide line will be located in the Ni-offset source region or a metal-offset source region.

Moreover, in the above embodiment, as shown in FIGS. 3B and 3C, the source and the drain regions are formed by an impurity doping process after forming an Ni pattern to define an Ni offset on the amorphous silicon layer, which can be processed in a reversed manner. Namely, a TFT is fabricated by doping the disclosed amorphous silicon layer with impurities, forming source and drain regions, by forming an Ni pattern to define an Ni offset on the amorphous silicon layer, and crystallizing the amorphous silicon layer. The remaining steps are as discussed above.

Figure 5:
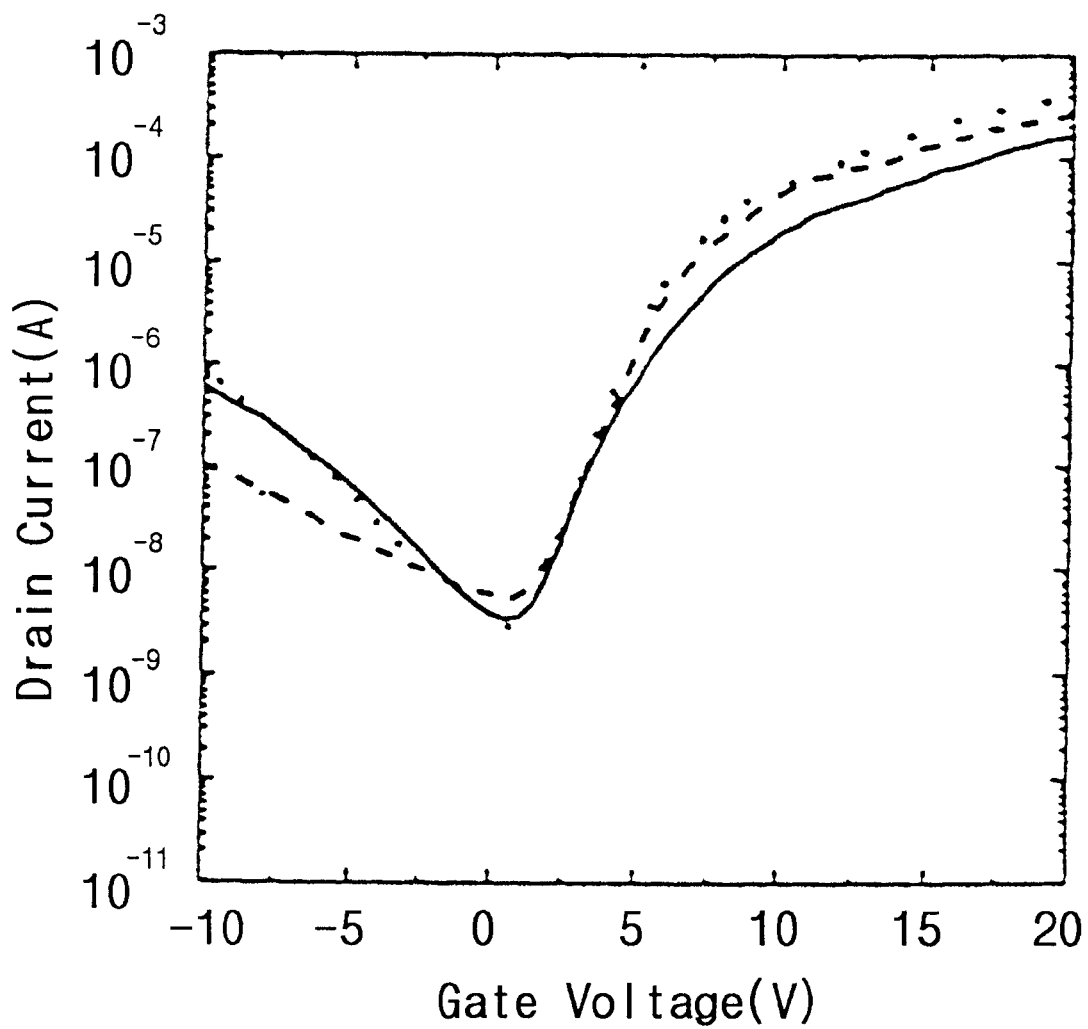
FIG. 5 shows the I-V characteristics of TFTs fabricated in accordance with the present invention and the conventional method respectively.

FIG. 5 shows the I-V characteristics of the n-type TFT's fabricated by the present invention and the conventional art, respectively.

The characteristics, related to threshold voltage and on-current, of a TFT according to the present invention is superior to that of a TFT of the conventional art. The prevention of the defect which interferes with the charge flow in the channel region improves the on-current characteristics since there is no Ni-silicide line in the channel region.

The following table indicates the device characteristics of an n-type TFT wherein a threshold voltage is 1V for example and a drain current is 0.1 $\mu$A, for example Field effect mobility is the value caculated in the linear area under the drain voltage of 0.1V. The maximum on/off current ratios are attained by the gate voltage between −10V to 20V and the drain voltage of 1V.

TABLE

| types of TFT's | Ni-offset source | Ni-offset drain | Conventional TFT |
|---|---|---|---|
| threshold voltage (V) | 2.5 | 2.5 | 3.3 |
| slopes of subthreshold voltage (V/dec) | 0.98 | 0.93 | 0.97 |
| field effect mobility (cm$^2$/V) | 120 | 82 | 60 |
| maximum on/off current ratios | 2E6 | 2E6 | 1.3E6 |

As shown in the table, the physical characteristics of the TFT having the Ni-offset in the source or the drain region according to the present invention are superior to those of the other TFT according to a conventional art.

Figure 6:
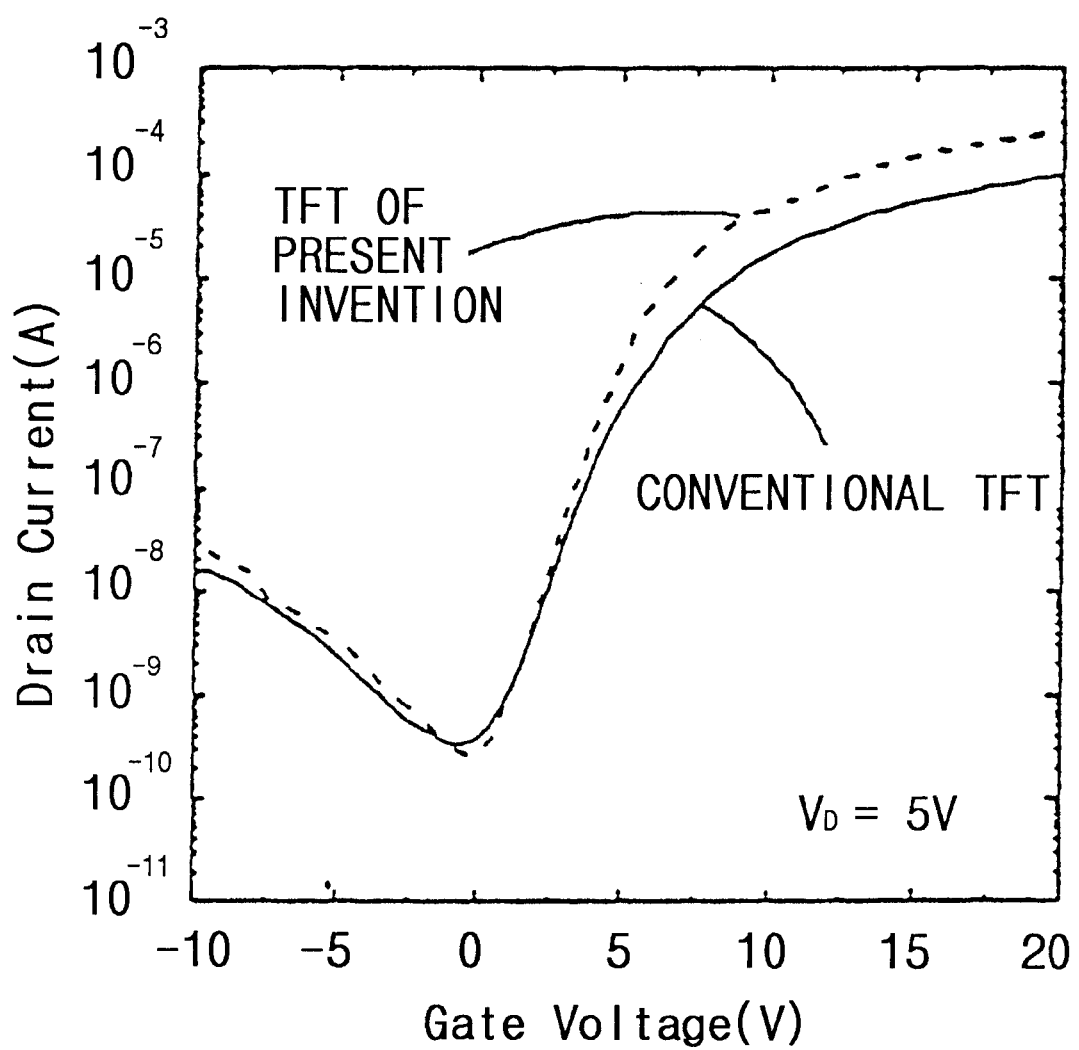
FIG. 6 shows the I-V characteristics of the TFTs fabricated in accordance with the present invention and the conventional method respectively, under a high drain voltage.

FIG. 6 shows the transfer characteristics and the I-V characteristics of the TFT's fabricated by the present invention and the conventional art, respectively, under high drain currents and high drain voltage of 10V.

Referring to FIG. 6, the leakage current of the TFT having the Ni-offset outside the drain region is a minimum or low value, which means that the degree or amount of the leakage current depends on the location of the Ni-offset.

In the above exemplary explanation by, defining the Ni-offset or a metal-offset on the source region or the drain region to have the Ni-silicide line or a metal-silicide line located in the drain or the source region, the present invention is also applicable to a method of having the Ni-silicide line or a metal-silicide line located outside the channel region. Namely, the Ni film is formed just on the drain region or the source region to define the Ni offset on the whole source or the drain region. Moreover, the present invention is further applicable to and suitable for any crystallization of other semiconductor material.

Accordingly, the present invention improves field effect mobility and threshold voltage by MILC and reduces leakage current by means of having the metal-silicide line generated from the crystallization of semiconductor outside the channel region. Accordingly, polycrystalline TFT's which are very effective and also highly reproductive are fabricated.

It will be apparent to those skilled in the art that various modifications and variations can be made in a method of fabricating a thin film transistor of the present invention without departing from the spirit or scope of the inventions. Thus, it is intended that the present invention cover the modifications and variations of this invention provided they come within the scope of the appended claims and their equivalents.

What is claimed is:

1. A method of fabricating a thin film transistor, the method comprising the steps of:

forming a semiconductor layer on a substrate, said semiconductor layer having at least a source region, a channel region and a drain region;

forming a gate insulating layer and a gate electrode on said channel region;

doping said source region and said drain region with impurity;

forming MILC metal on at least a part of said source region and said drain region; and crystallizing said semiconductor layer by applying thermal treatment to said semiconductor layer having said MILC metal, whereby said semiconductor layer is crystallized by MILC propagating from the portions of said source region and said drain region covered by said MILC metal such that a boundary between the areas of said semiconductor layer respectively crystallized by the MILC propagated from the portions of said source region and drain region covered by said MILC metal is formed outside of said channel region.

2. The method of fabricating a thin film transistor according to claim 1, wherein said MILC metal is formed on said semiconductor layer to form a metal offset region in said source or said drain region, said metal offset region being adjacent to said gate electrode.

3. The method of fabricating a thin film transistor according to claim 2, wherein said step of forming said MILC metal comprises the steps of:

forming a photoresist pattern covering at least a part of said source or said drain region and said gate region;

forming said MILC metal on a whole surface of said substrate and said photoresist pattern; and removing said photoresist pattern to form said metal offset region.

4. The method of fabricating a thin film transistor according to claim 3, wherein said photoresist pattern is formed to cover a portion of said source or said drain region, said portion of said source or said drain region being adjacent to said gate electrode.

5. The method of fabricating a thin film transistor according to claim 1, wherein said metal film pattern is formed by using one or a mixture of metal including Ni, Pd, Ti, Ag, Au, Al, Sn, Sb, Cu, Co, Cr, Mo, Tr, Ru, Rh, Cd, Pt or the like.

6. The method of fabricating a thin film transistor according to claim 1, wherein said metal film pattern is formed to a thickness of about 20–200Å.

7. The method of fabricating a thin film transistor according to claim 2, wherein said metal film pattern is formed to a thickness of about 20–200Å.

8. The method of fabricating a thin film transistor according to claim 3, wherein said metal film pattern is formed to a thickness of about 20–200Å.

9. The method of fabricating a thin film transistor according to claim 4, wherein said metal film pattern is formed to a thickness of about 20–200Å.

10. The method of fabricating a thin film transistor according to claim 5, wherein said metal film pattern is formed to a thickness of about 20–200Å.

11. The method of fabricating a thin film transistor according to claim 1, wherein said thermal treatment is performed a temperature of about 300–500° C.

12. The method of fabricating a thin film transistor according to claim 2, wherein said thermal treatment is performed at a temperature of about 300–500° C.

13. The method of fabricating a thin film transistor according to claim 3, wherein said thermal treatment is performed at a temperature of about 300–500° C.

14. The method of fabricating a thin film transistor according to claim 4, wherein said thermal treatment is performed at a temperature of about 300–500° C.

15. The method of fabricating a thin film transistor according to claim 5, wherein said thermal treatment is performed at a temperature of about 300–500° C.

16. The method of fabricating a thin film transistor according to claim 1, further comprising a step of forming a lightly doped drain (LDD) region or an offset junction region in said semiconductor layer.

17. The method of fabricating a thin film transistor according to claim 2, further comprising a step of forming a lightly doped drain (LDD) region or an offset junction region in said semiconductor layer.

18. The method of fabricating a thin film transistor according to claim 3, further comprising a step of forming a lightly doped drain (LDD) region or an offset junction region in said semiconductor layer.

19. The method of fabricating a thin film transistor according to claim 4, further comprising a step of forming a lightly doped drain (LDD) region or an offset junction region in said semiconductor layer.

20. The method of fabricating a thin film transistor according to claim 5, further comprising a step of forming a lightly doped drain (LDD) region or an offset junction region in said semiconductor layer.

* * * * *